(12) United States Patent
Voogel et al.

(10) Patent No.: US 7,110,281 B1
(45) Date of Patent: Sep. 19, 2006

(54) MEMORY CELLS UTILIZING METAL-TO-METAL CAPACITORS TO REDUCE SUSCEPTIBILITY TO SINGLE EVENT UPSETS

(75) Inventors: Martin L. Voogel, Los Altos, CA (US); Steven P. Young, Boulder, CO (US)

(73) Assignee: XILINX, Inc., San Jose, CA (US)

( * ) Notice: Subject to any disclaimer, the term of this patent is extended or adjusted under 35 U.S.C. 154(b) by 106 days.

(21) Appl. No.: 10/864,240

(22) Filed: Jun. 8, 2004

(51) Int. Cl.
*G11C 11/24* (2006.01)

(52) U.S. Cl. .................... 365/149; 365/63; 365/72; 365/104; 365/156; 365/174; 257/401; 257/409; 257/300; 257/379

(58) Field of Classification Search ............... 365/149, 365/63, 72, 104, 156, 174; 257/40, 409, 257/300, 379
See application file for complete search history.

(56) References Cited

U.S. PATENT DOCUMENTS

| | | | |
|---|---|---|---|
| 4,638,463 A * | 1/1987 | Rockett, Jr. ............... | 365/205 |
| 4,912,675 A * | 3/1990 | Blake et al. ............... | 365/154 |
| 4,984,203 A * | 1/1991 | Shookhtim et al. ........ | 365/177 |
| 5,046,044 A * | 9/1991 | Houston et al. ............ | 365/156 |
| 5,220,532 A * | 6/1993 | Kertis ........................ | 365/190 |
| 5,341,009 A * | 8/1994 | Young et al. .............. | 257/296 |
| 5,681,769 A * | 10/1997 | Lien ........................... | 438/297 |

(Continued)

FOREIGN PATENT DOCUMENTS

| JP | 407161843 A * | 6/1995 |
|---|---|---|
| JP | 409036252 A * | 2/1997 |
| JP | WO009963542 A1 * | 12/1999 |

(Continued)

OTHER PUBLICATIONS

U.S. Appl. No. 10/864,254, filed Jun. 8, 2004, Voogel et al.

(Continued)

*Primary Examiner*—Viet Q. Nguyen
(74) *Attorney, Agent, or Firm*—Lois D. Cartier

(57) ABSTRACT

Structures and methods of adding metal-to-metal capacitors to static memory cells to reduce susceptibility to SEUs. The addition of metal-to-metal capacitors is particularly suited to programmable logic devices (PLDs), because of the relatively large area required to implement an effective metal-to-metal capacitor, compared (for example) to the size of the static memory cell itself. The configuration memory cells of PLDs are typically placed next to other logic (e.g., the configurable elements controlled by the configuration memory cells) that can be overlain by the metal-to-metal capacitors. Therefore, metal-to-metal capacitors can be used in PLD configuration memory cells where they might be impractical in simple memory arrays. However, metal-to-metal capacitors can also be applied to integrated circuits other than PLDs.

12 Claims, 10 Drawing Sheets

U.S. PATENT DOCUMENTS

| | | | |
|---|---|---|---|
| 5,691,935 A * | 11/1997 | Douglass | 365/149 |
| 5,844,837 A * | 12/1998 | Yoshikawa | 365/156 |
| 5,905,290 A * | 5/1999 | Houston | 257/380 |
| 5,917,221 A * | 6/1999 | Takemura | 257/365 |
| 6,104,631 A * | 8/2000 | El-Sharawy et al. | 365/154 |
| 6,111,780 A * | 8/2000 | Bertin | 365/154 |
| 6,369,630 B1 * | 4/2002 | Rockett | 327/210 |
| 6,510,076 B1 * | 1/2003 | Lapadat et al. | 365/154 |
| 6,703,858 B1 * | 3/2004 | Knowles | 326/9 |
| 6,870,404 B1 | 3/2005 | Maangat | |
| 6,876,572 B1 | 4/2005 | Turner | |
| 6,961,279 B1 * | 11/2005 | Simko | 365/226 |
| 6,970,374 B1 * | 11/2005 | Lin | 365/154 |
| 6,980,462 B1 * | 12/2005 | Ramesh et al. | 365/154 |

FOREIGN PATENT DOCUMENTS

| | | |
|---|---|---|
| JP | 02002083882 A * | 3/2002 |
| JP | 02004146844 A * | 5/2004 |
| JP | 02004342790 A * | 12/2004 |

OTHER PUBLICATIONS

STMicroelectronics; "New Chip Technology from STMicroelectronics Eliminates "Soft Error" Threat to Electronic Systems"; downloaded on Mar. 15, 2004 from http://www.stmicroelectronics.com/stonline/press/news/year2003/t1394h.htm; pp. 1-3.

* cited by examiner

MEMORY CELLS UTILIZING METAL-TO-METAL CAPACITORS TO REDUCE SUSCEPTIBILITY TO SINGLE EVENT UPSETS

FIELD OF THE INVENTION

The invention relates to memory cells subject to single event upsets (SEUs). More particularly, the invention relates to structures and methods of reducing the susceptibility of memory cells to SEUs by adding metal-to-metal capacitors thereto.

BACKGROUND OF THE INVENTION

Programmable logic devices (PLDs) are a well-known type of integrated circuit that can be programmed to perform specified logic functions. FIG. 1 is a simplified illustration of one type of PLD, the Field Programmable Gate Array (FPGA). An FPGA typically includes an array of configurable logic blocks (LBs 101a–101i) and programmable input/output blocks (I/Os 102a–102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., delay lock loops (DLLs), random access memory (RAM), and so forth.

The interconnect structure and logic blocks are typically programmed by loading a stream of configuration data into internal configuration memory cells that define how the interconnection array and logic blocks are configured. The configuration data can be read from memory (e.g., from an external PROM) or written into the FPGA by an external device. The collective states of the individual memory cells then determine the function of the FPGA. In FPGAs, for example, configuration memory cells are typically implemented as static RAM cells. Each FPGA typically contains many thousands or even millions of these static RAM configuration memory cells.

When bombarded by high-energy particles, a static RAM cell can change state. For example, a stored high value can be inadvertently changed to a low value, and vice versa. These inadvertent and undesired state changes are known as "single event upsets", or SEUs. Sometimes an SEU has no effect on the functionality of the design, e.g., when the SEU shorts together two unused interconnect lines. At other times, an SEU can change the function of an FPGA such that the circuit implemented in the FPGA no longer functions properly.

The smaller geometries, lower operating voltages, and larger numbers of memory cells included in new generations of PLDs can render these devices more susceptible to SEUs than their predecessors. Therefore, it is desirable to provide methods of reducing the susceptibility to SEUs of a design implemented in a PLD. It is further desirable to reduce the susceptibility to SEUs of any integrated circuit that includes static memory cells.

SUMMARY OF THE INVENTION

The invention provides structures and methods of reducing the susceptibility of PLD configuration memory cells to SEUs by selectively adding metal-to-metal capacitors thereto. By adding capacitance to storage nodes in a memory cell, the susceptibility of the memory cell to SEUs is reduced. However, the performance of the memory cell also suffers. In PLD configuration memory cells, performance is not the most important factor, as the contents of a configuration memory cell typically do not change once the PLD has been initially configured. Therefore, for example, SEU-reducing capacitors can be selectively added to the PLD configuration memory cells while omitting the capacitors from user storage elements (e.g., block RAM) within the PLD. Thus, performance of the user storage elements is not adversely affected.

The addition of metal-to-metal capacitors is particularly suited to PLDs because of the relatively large area required to implement an effective metal-to-metal capacitor, compared (for example) to the size of the static memory cell itself. The configuration memory cells of PLDs are typically placed next to other logic (e.g., the configurable elements controlled by the configuration memory cells) that can be overlain by the metal-to-metal capacitors. Therefore, metal-to-metal capacitors can be used in PLD configuration memory cells where they might be impractical in simple memory arrays. However, this aspect of the invention can also be applied to integrated circuits other than PLDs.

The invention also comprises methods of implementing PLDs and other integrated circuits to reduce susceptibility to SEUs, utilizing the metal-to-metal capacitors described above and throughout the present specification and drawings.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 2:
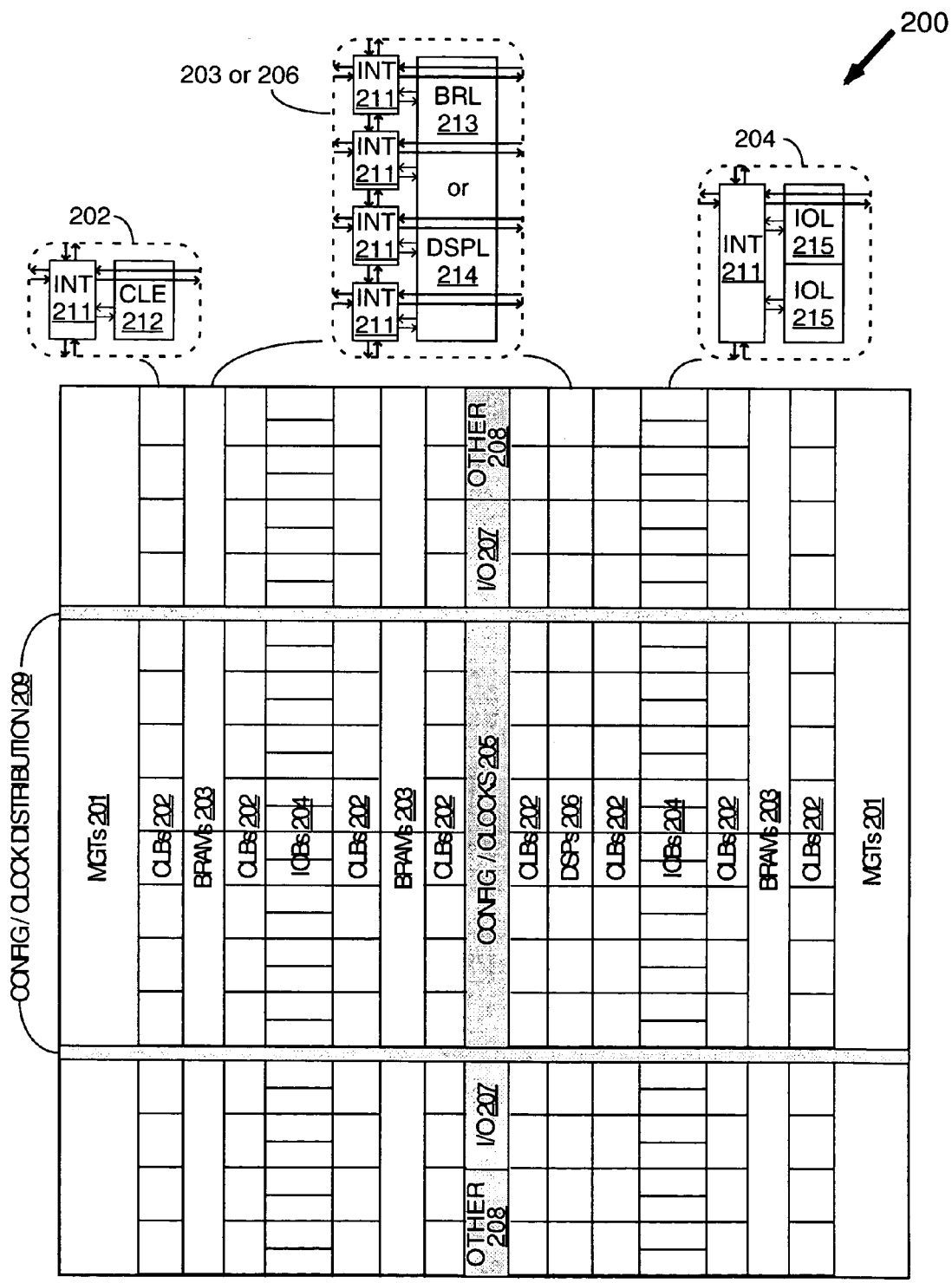
FIG. 2 is a block diagram of a Xilinx FPGA.

As noted above, advanced FPGAs can include several different types of programmable logic blocks in the array. For example, FIG. 2 illustrates an FPGA architecture 200 from Xilinx, Inc. that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An 1OB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
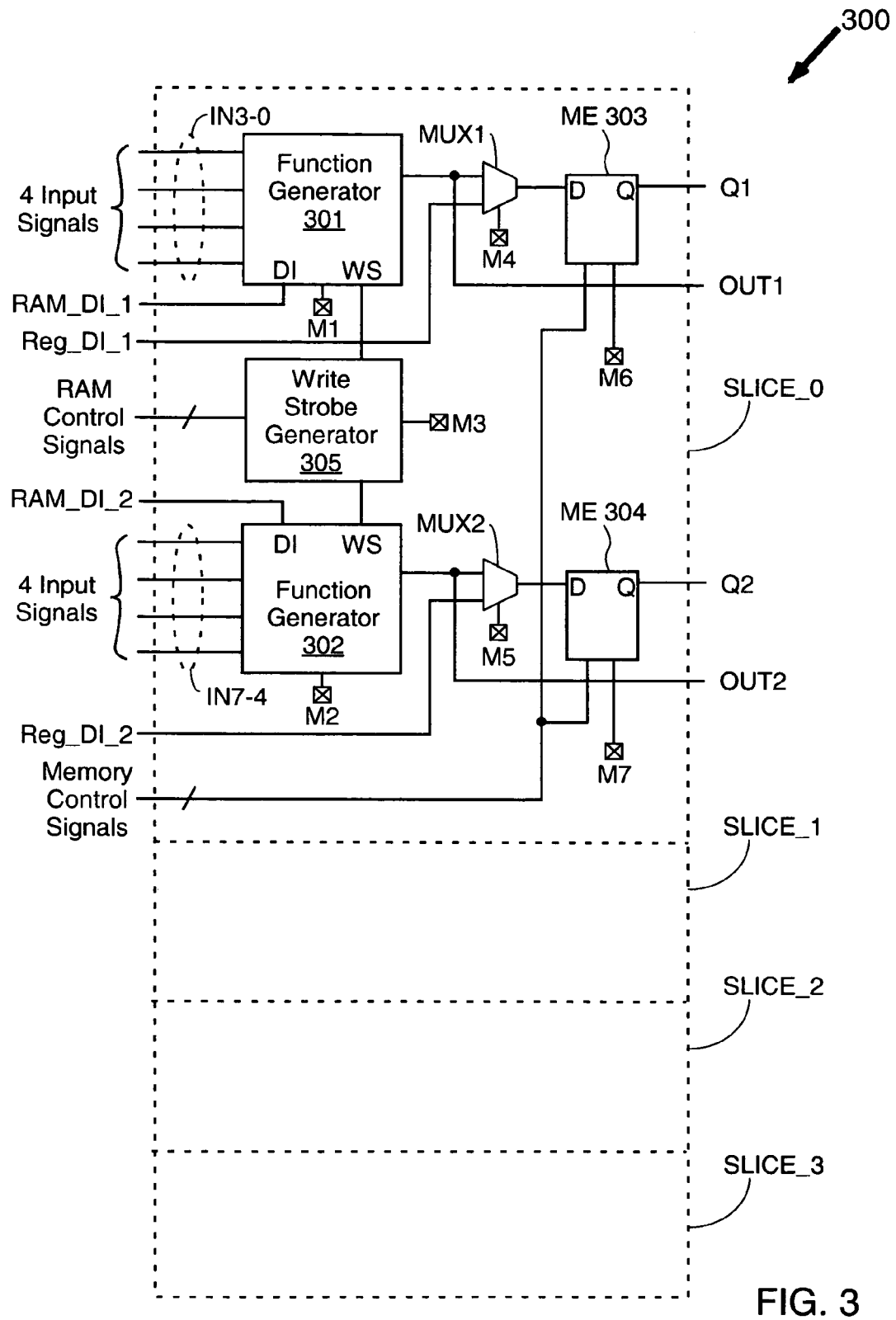
FIG. 3 is a simplified illustration of a known configurable logic block (CLB) in a Xilinx FPGA.

FIG. 3 illustrates in simplified form a configurable logic block (CLB) for a exemplary-Xilinx FPGA. (Note, however, that the interconnect portion of the logic block is not shown in FIG. 3.) CLB 300 of FIG. 3 includes four similar slices SLICE_0–SLICE_3. Each slice includes two lookup tables (LUTs) 301 and 302, a write strobe generator circuit 305, two multiplexers MUX1 and MUX2, and two output memory elements 303 and 304. The lookup tables, write strobe generator circuit, multiplexers, and output memory elements are all controlled by configuration memory cells M1–M7. (At least some of configuration memory cells M1–M7 represent more than one memory cell. Additional configuration memory cells and logic elements are omitted from FIG. 3, for clarity.)

Each LUT 301, 302 can function in any of several modes. When in lookup table mode, each LUT has four data input signals IN1–IN4 that are supplied by the FPGA interconnect structure (not shown) via input multiplexers (not shown). (In the present specification, the same reference characters are used to refer to terminals, signal lines, and their corresponding signals.) When in RAM mode, input data is supplied by an input terminal RAM_DI_1, RAM_DI_2 to the DI terminal of the associated LUT. RAM write operations in both LUTs are controlled write strobe generator circuit 305, which supplies a write strobe signal WS to both LUTs based on RAM control signals provided by the interconnect structure.

Each LUT 301, 302 provides a LUT output signal to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (303, 304 respectively). Memory elements 303 and 304 are clocked by a clock signal CK (e.g., provided by a global clock network) and controlled by various other register control signals (e.g., from the interconnect structure or provided by configuration memory cells of the FPGA). Each memory-element 303, 304 provides a registered output signal Q1, Q2. The output of each LUT 301, 302 is also provided to an output terminal OUT1, OUT2 of the CLB. Thus, each output memory element can be optionally bypassed. The slice also includes output multiplexers (not shown) that select from among the various output signals of the slice and provide the selected signals to the FPGA interconnect structure. These output multiplexers are also controlled by configuration memory cells (not shown).

Figure 1:
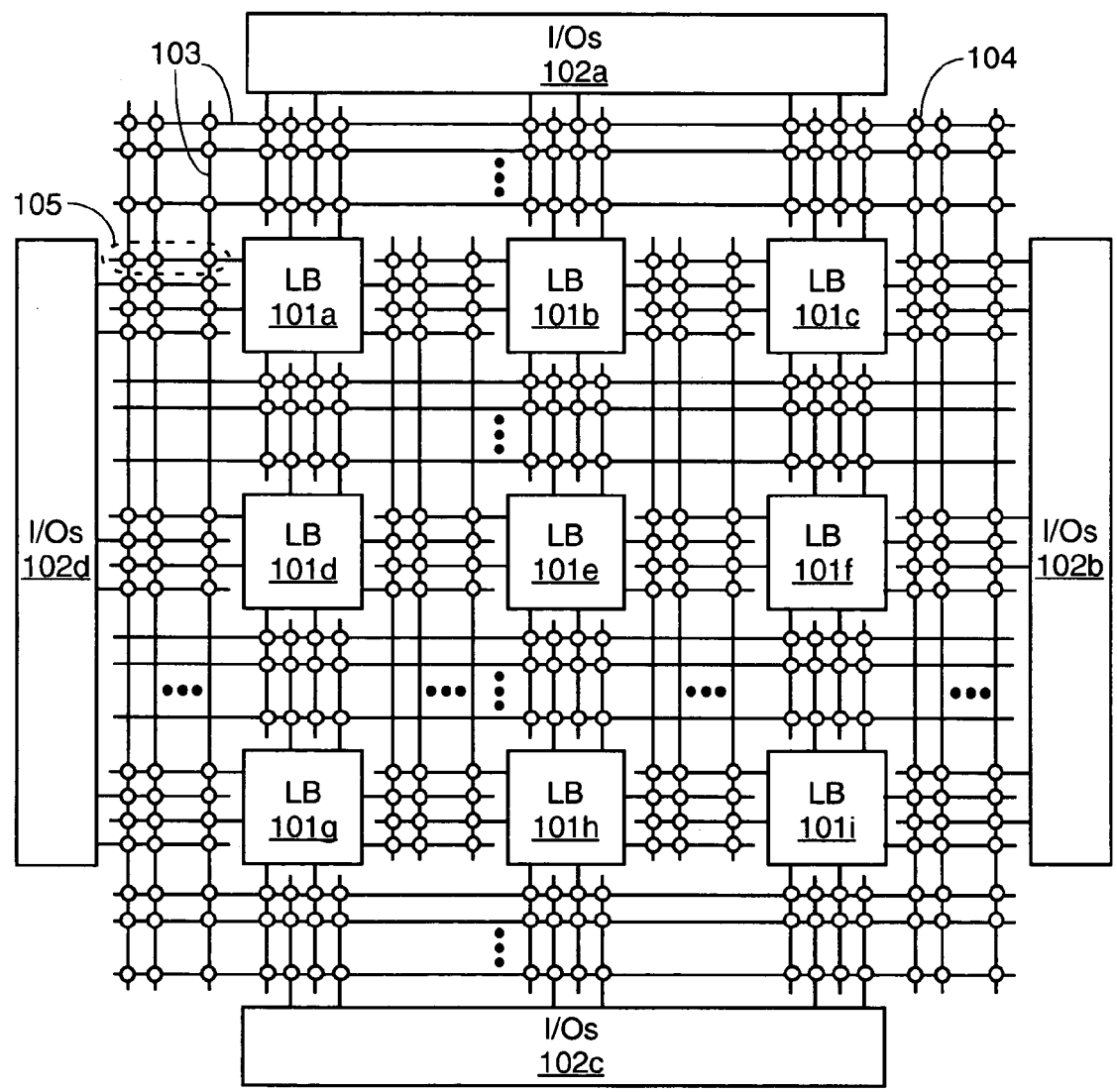
FIG. 1 is a simplified diagram of a well known Field Programmable Gate Array (FPGA) architecture.
Figure 4:
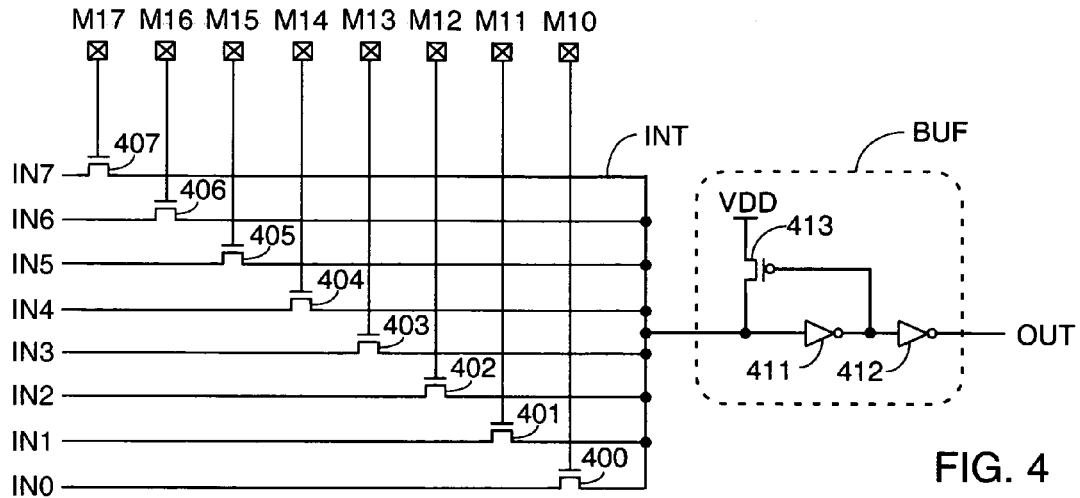
FIG. 4 illustrates a simple well-known programmable multiplexer that can be used, for example, to implement a routing multiplexer in an FPGA.

As described above, programmable interconnect points (PIPs) are often coupled into groups (e.g., group 105 of FIG. 1) that implement multiplexer circuits selecting one of several interconnect lines to provide a signal to a destination interconnect line or logic block. A routing multiplexer can be implemented, for example, as shown in FIG. 4. The illustrated circuit selects one of several different input signals and passes the selected signal to an output terminal.

The circuit of FIG. 4 includes eight input terminals IN0–IN7 and eight pass gates 400–407 that selectively pass one of signals IN0–IN7, respectively, to an internal node INT. Each pass gate 400–407 has a gate terminal driven by a configuration memory cell M10–M17, respectively. The signal on internal node INT is buffered by buffer BUF to provide output signal OUT. Buffer BUF includes two inverters 411, 412 coupled in series, and a pull up (e.g., a P-channel transistor 413 to power high VDD) on internal node INT and driven by the node between the two inverters.

Clearly, at most one of configuration memory cells M10–M17 can be configured with a high value at any given time. Other configurations are not supported by the circuit. The one configuration memory cell with a high value selects the associated input signal IN0–IN7 to be passed to internal node INT, and hence to output node OUT. If none of memory cells M10–M17 is configured with a high value, output signal OUT is held at its initial high value by pullup 413.

Figure 5:
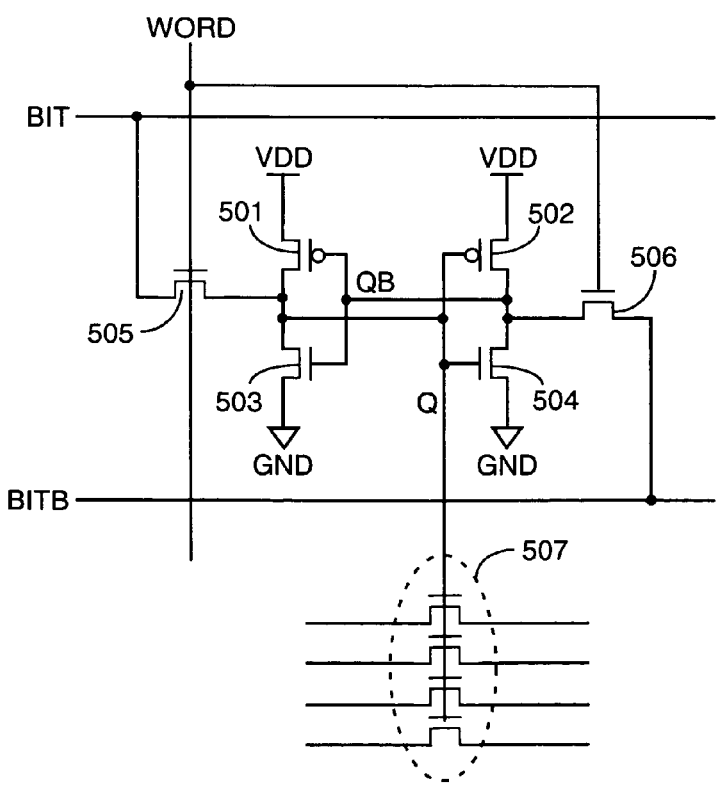
FIG. 5 illustrates a configuration memory cell in a known FPGA, and the use thereof to control pass gates within the FPGA.

FIG. 5 illustrates a known configuration memory cell and pass gates controlled by the configuration memory cell. A configuration memory cell typically includes two cross-coupled logic gates, such as the two inverters formed by P-channel transistor 501 and N-channel transistor 503, and by P-channel transistor 502 and N-channel transistor 504. The output nodes of the two cross-coupled logic gates are referred to herein as "storage nodes". The storage node of the first inverter is node Q. In FIG. 5, node Q drives pass gates 507. Pass gates 507 can be, for example, part of a routing multiplexer, lookup table, user storage element (e.g., block RAM or any other type of memory available for the storage of user data), or other configurable logic element. In some configuration memory cells, node QB, the storage node of the second inverter, drives the pass gates. In some configuration memory cells, both storage nodes Q and QB are used to drive logic external to the cell.

An N-channel transistor 505 is coupled between node Q and a first bit line BIT, and gated by a word line WORD. Another N-channel transistor 506 is coupled between node QB and a second bit line BITB, which carries an inverse value from the first bit line. Transistor 506 is also gated by word line WORD. Bit lines BIT and BITB are used to carry values written to the configuration memory cell, and also to read values from the configuration memory cell, e.g., during a configuration readback procedure. Variations on the circuit of FIG. 5 are also well known, e.g., two word lines can be provided, or only one bit line can be included. The circuit of FIG. 5 is a representative example of the various well-known memory cell configurations.

Note that by its very nature the circuit of FIG. 5 includes a certain amount of parasitic capacitance on nodes Q and QB. For example, the physical connection between node Q and pass gates 507 has an associated capacitance, and the wire making this physical connection typically passes over other structures within the circuit. It is common in commercial SRAM devices to keep this parasitic capacitance as small as possible, because the capacitance has the effect of slowing down the operation of the memory cell. However, the parasitic capacitance also has the advantageous effect of reducing the susceptibility of the memory cell to SEUs.

The present inventors have recognized that configuration memory cells in PLDs occupy an unusual position in this regard. The speed at which PLD configuration memory cells are written is not an important consideration. Therefore, additional capacitance in a PLD configuration memory cell has little or no effect on the performance of a user design implemented in the PLD. Capacitance can be deliberately added to configuration memory cells in the PLD, while omitting the added capacitance from the user memory cells, i.e., other memory cells that are utilized by a design implemented in the PLD (e.g., block RAM). The term "added capacitance" is used herein to refer to the otherwise unnecessary capacitance added to a memory cell to reduce the susceptibility to SEUs, as opposed to the "intrinsic capacitance" inherent to the implementation of the logic.

In some PLDs, the user memory cells are inherently less susceptible to SEUs than the configuration memory cells. For example, the user memory cells in block RAM typically have a larger intrinsic capacitance on the storage nodes, due to heavier loading, which imparts an increased resistance to SEUs. Therefore, little SEU resistance capability is lost by restricting the added capacitance to the configuration memory cells. Additionally, other methods are often available to preserve data in block RAM that are impractical for configuration memory cells, such as using error correction codes (ECC) to correct the user data each time the data is read from the RAM.

Figure 6:
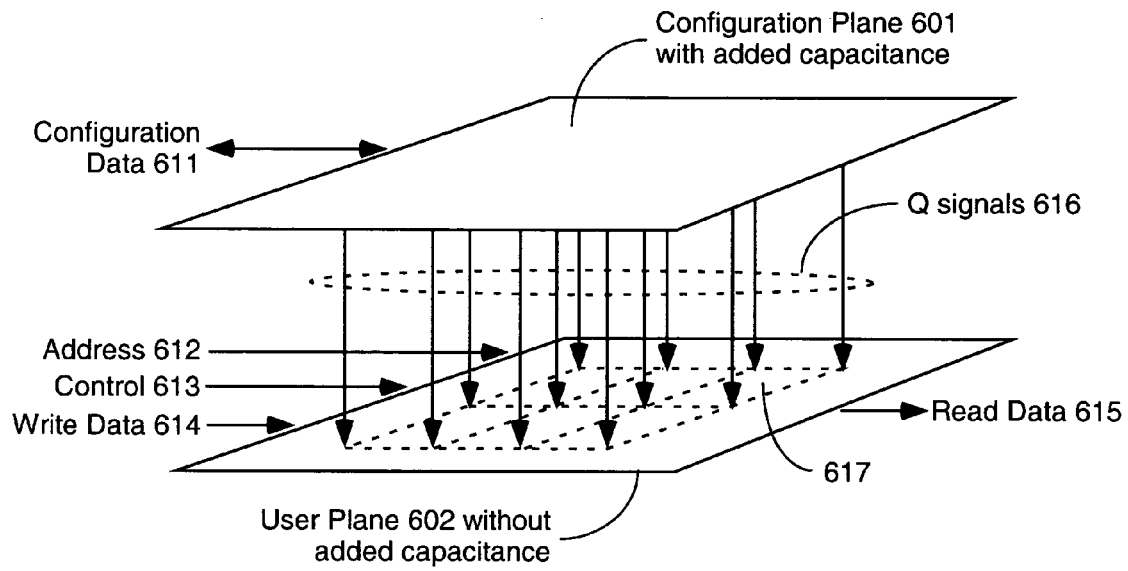
FIG. 6 illustrates how additional capacitance can be selectively added to configuration memory cells in a programmable logic device (PLD) to reduce the susceptibility of a design to single event upsets (SEUs) without adversely impacting design performance.

FIG. 6 provides a conceptual illustration of a PLD to which capacitance is selectively added to reduce SEU susceptibility without adversely impacting the performance of a design implemented in the PLD. In FIG. 6, the PLD is conceptualized as having two planes of logic, a configuration plane 601 and a user plane 602. Note that in present technology the two planes are not physically separated, as shown in FIG. 6, although the invention does not rule out such a separation. Instead, the two planes include logic that is typically interspersed. The configuration plane includes configuration memory cells (not shown) and configuration logic (not shown) that receives configuration data 611 and stores the configuration data in the configuration memory cells. As indicated by the two-headed arrow to and from configuration data 611, configuration data can also often be read from the configuration memory cells in a process sometimes referred to as "configuration readback". The configuration memory cells in the configuration plane have added capacitance to reduce their susceptibility to SEUs.

Control signals (Q, 616) from the configuration plane 601 are provided to configurable user elements 617 in the user plane 602. The configurable user elements can include, for example, user storage elements such as a block RAM, a routing multiplexer, a lookup table, a CLB, or other programmable elements. When the configurable user elements are block RAM, for example, the user plane 602 receives address signals 612, control signals 613, and write data 614 from other portions of the user design, and provides read data 615 to yet other portions of the design. The memory cells in the user plane do not include the added capacitance. Importantly, the speed at which the user plane receives, stores, and provides data is not affected by the added capacitance in the configuration memory cells. The rate at which the configuration data is written to the configuration memory cells is somewhat reduced. However, these alterations have no effect on the speed of operation of a user design.

Note that in some PLDs a lookup table (LUT) can be considered to be a part of either the configuration plane or the user plane, depending on how the lookup table is configured. For example, in some PLDs, a LUT can only be used as a configured table of values that always provides the same output value in response to a given set of input values. In more advanced PLDs, a LUT can also be configured to function as a user storage element, e.g., addressable user RAM.

In the past, manufacturers of static RAM arrays have reduced the susceptibility of their devices to SEUs by adding capacitance to the static RAM cells in a vertical fashion, as described in a document from STMicroelectronics dated Dec. 15, 2003. The document is entitled 'New Chip Technology from STMicroelectronics Eliminates "Soft Error" Threat to Electronic Systems', Company Information Document No. T1394H, and can be found at the following internet address: http://stmicroelectronics.com/stonline/press/news/year2003/t1394h.htm. The document does not discuss any performance degradation that might have resulted from the addition of the vertical capacitors. This approach also requires additional and non-standard fabrication steps that add to the manufacturing costs of the static RAM arrays.

The use of a vertical capacitor structure can be desirable in static RAM arrays, because a traditional horizontal structure would increase the cell size of the memory cell in the tightly packed memory array, and could significantly increase the cost of the overall IC. However, configuration memory cells in PLDs are not necessarily subject to such limitations. As noted above in regard to FIG. 6, the user plane and the configuration plane are typically interleaved. In other words, the configuration memory cell and the programmable logic controlled by the configuration memory cell often sit side-by-side on the surface of the die. This layout approach enables the use of a novel metal-to-metal capacitor implementation. In some embodiments, the added capacitor comprises a horizontal, metal-to-metal capacitor that overlays both the configuration memory cell and the programmable logic controlled by the configuration memory cell. While a metal-to-metal capacitor the size of a typical RAM cell is typically not large enough to provide sufficient SEU protection, adding the surface area of the programmable logic enables the inclusion of a larger metal-to-metal capacitor.

Figure 7:
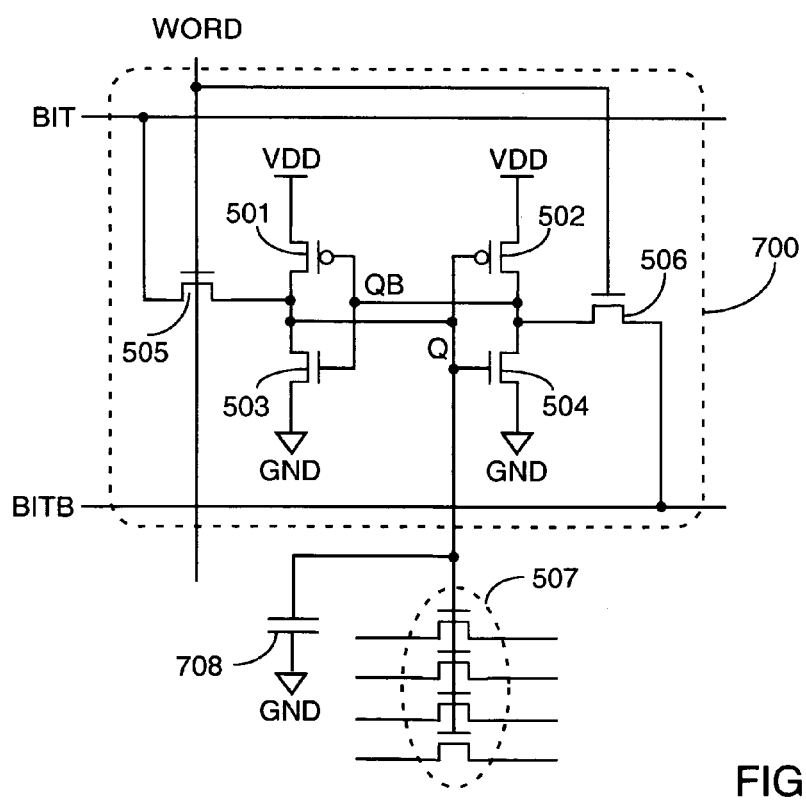
FIG. 7 is a schematic diagram of a configuration memory cell according to an embodiment of the invention.

FIG. 7 illustrates a first PLD configuration memory cell having an added metal-to-metal capacitor at one of the storage nodes. The circuit of FIG. 7 is similar to that of FIG. 5. However, in the embodiment of FIG. 7 the capacitance on node Q is deliberately increased to reduce susceptibility to SEUs. The added capacitance can take the form of an added metal-to-metal capacitor 708 between node Q and ground GND, for example, as shown in FIG. 7. The added capacitance can also be achieved by deliberately increasing the parasitic capacitance between node Q and other nodes in the PLD, e.g., by adding protrusions ("fingers") of metal to node Q to fill all of the available area. These other nodes can be nodes within the configuration memory cell, or nodes outside the configuration memory cell. Parasitic capacitance to various other nodes is often modeled by a capacitor to ground, as shown in FIG. 7.

Note that metal-to-metal capacitor 708 extends beyond a boundary 700 of the configuration memory cell. (The term "boundary" as used herein refers to the boundaries in the horizontal (x,y) plane of the layout, and not in the vertical (z) plane. A boundary is a conceptual dividing line between two physical areas. As used herein, the term "boundary" as applied to a configuration memory cell or other static memory cell refers to the dividing lines between two memory cells placed at a minimum distance, or between the memory cell and other logic also placed at a minimum distance. Memory cells can sometimes be "mirrored" along a boundary to minimize the size of a memory array.) The extension of the metal-to-metal capacitor beyond the boundary of the configuration memory cell provides the area required to implement a large enough capacitor to reduce the susceptibility of the memory cell to SEUs. For example, in some embodiments metal-to-metal capacitor 708 extends across at least a portion of the pass gates 507 controlled by the configuration memory cell. In some embodiments, metal-to-metal capacitor 708 extends across an area at least twice the size of the configuration memory cell.

Figure 8:
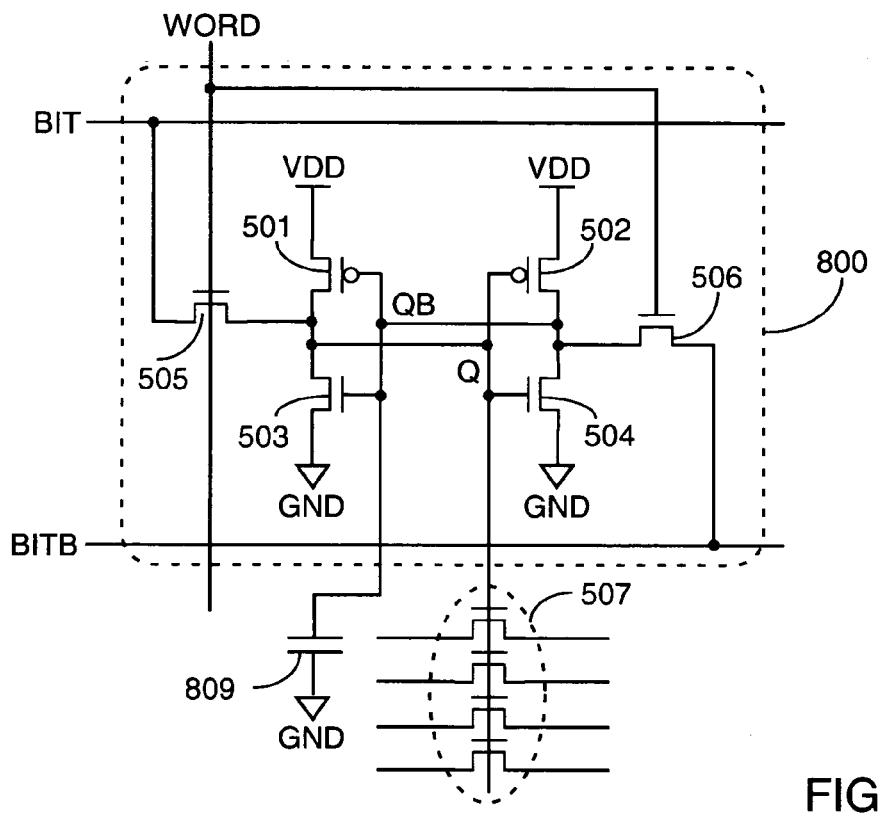
FIG. 8 is a schematic diagram of a configuration memory cell according to another embodiment of the invention.

FIG. 8 illustrates another way in which an added metal-to-metal capacitor can be used to reduce the susceptibility of a PLD configuration memory cell to SEUs. In the circuit of FIG. 8, the metal-to-metal capacitor is added to node QB instead of node Q, i.e., the capacitance is added to the node not driving pass gates 507. This implementation may in fact be more desirable than that of FIG. 8, because node QB inherently has less capacitance than node Q, rendering node QB more susceptible to SEUs. The added capacitance can be added in the form of a metal-to-metal capacitor 809 coupled between node QB and ground GND, as shown in FIG. 8, or by deliberately increasing the parasitic capacitance between node QB and other nodes in the PLD, e.g., by adding protrusions ("fingers") of metal to node QB to fill all of the available area. Metal-to-metal capacitor 809 extends beyond a boundary 800 of the configuration memory cell, e.g., as described above in conjunction with FIG. 7.

Figure 9:
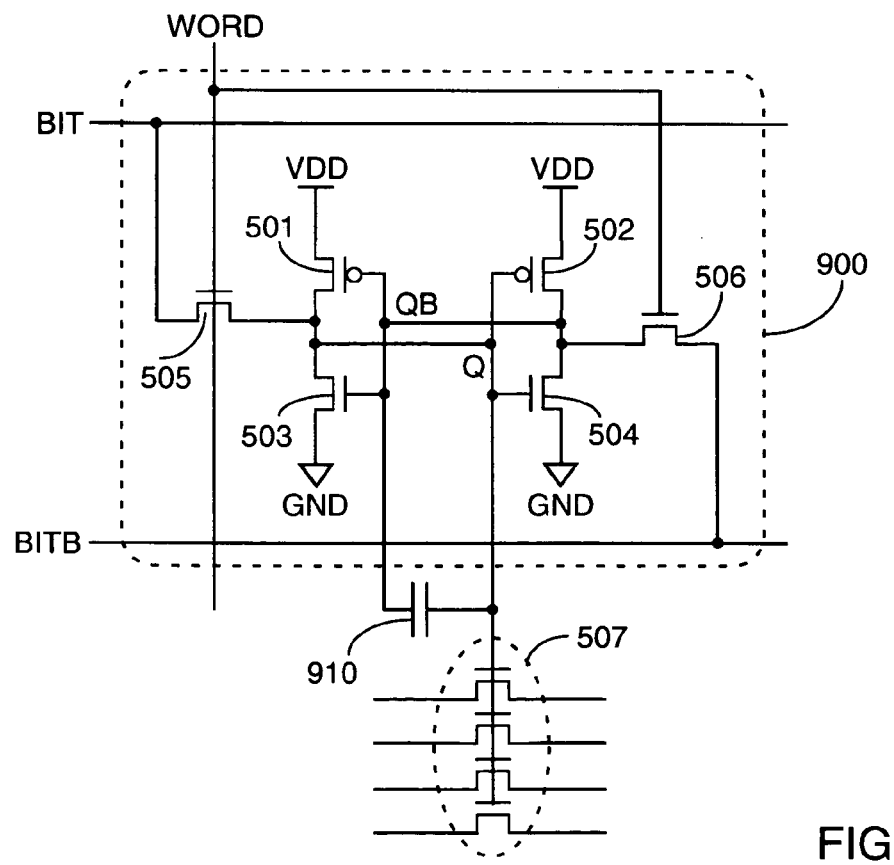
FIG. 9 is a schematic diagram of a configuration memory cell according to yet another embodiment of the invention.

FIG. 9 illustrates an embodiment in which the added metal-to-metal capacitor renders both storage nodes Q and QB less susceptible to SEUs. In the embodiment of FIG. 9, a metal-to-metal capacitor 910 is added between the two storage nodes Q and QB. Thus, both storage nodes are rendered less susceptible to SEUs. Additionally, adding the capacitor between the two storage nodes gives the two nodes a coupling capacitance that causes them to tend to rise and fall in tandem. If one of the two nodes experiences a rise in voltage due to an alpha particle, for example, the voltage on the other node moves higher as well. Thus, the change in the relative voltages of the two nodes is reduced, reducing the likelihood of flipping the stored value. Metal-to-metal capacitor 910 extends beyond a boundary 900 of the configuration memory cell, e.g., as described above in conjunction with FIG. 7.

Variations of the circuits of FIGS. 7–9 can be easily derived, e.g., two word lines can be provided, or only one bit line can be included, and so forth. It will be apparent to one skilled in the art after reading this specification that the present invention can be practiced within these and other architectural variations.

Figure 10:
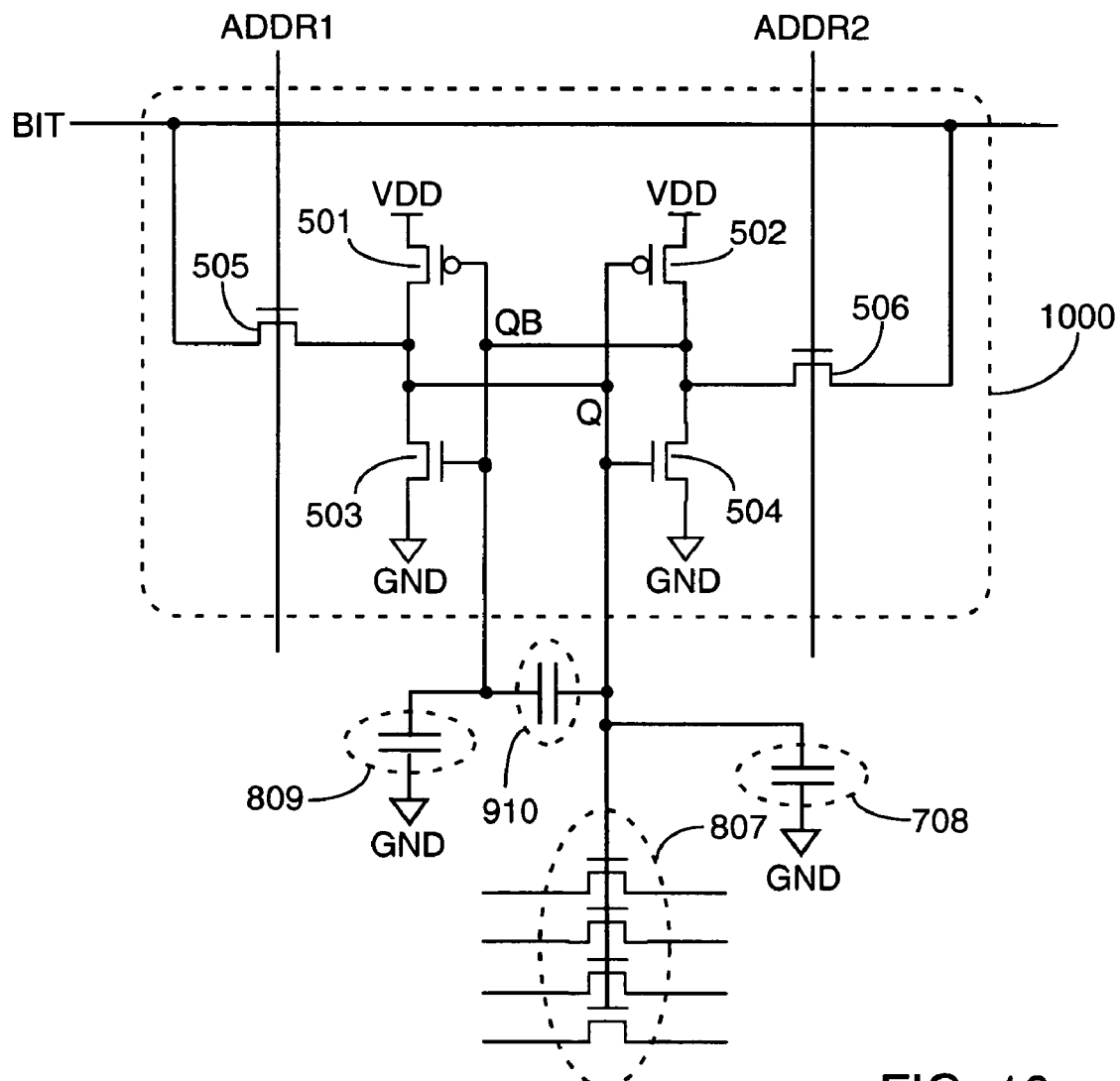
FIG. 10 is a schematic diagram of a configuration memory cell according to another embodiment of the invention.

One such architectural variation is illustrated in FIG. 10. The configuration memory cell of FIG. 10 includes the same elements as the cells of FIGS. 7–9, and similar elements are similarly numbered. Both N-channel transistors 505, 506 are coupled between their respective storage nodes Q, QB and the single bit line BIT. N-channel transistor 505 is gated by a first address line ADDR1. N-channel transistor 506 is gated by a second address line ADDR2. Any of metal-to-metal capacitors 708, 809, and 910 (or any combination of these capacitors) can be added to the memory cell of FIG. 10.

Figure 11:
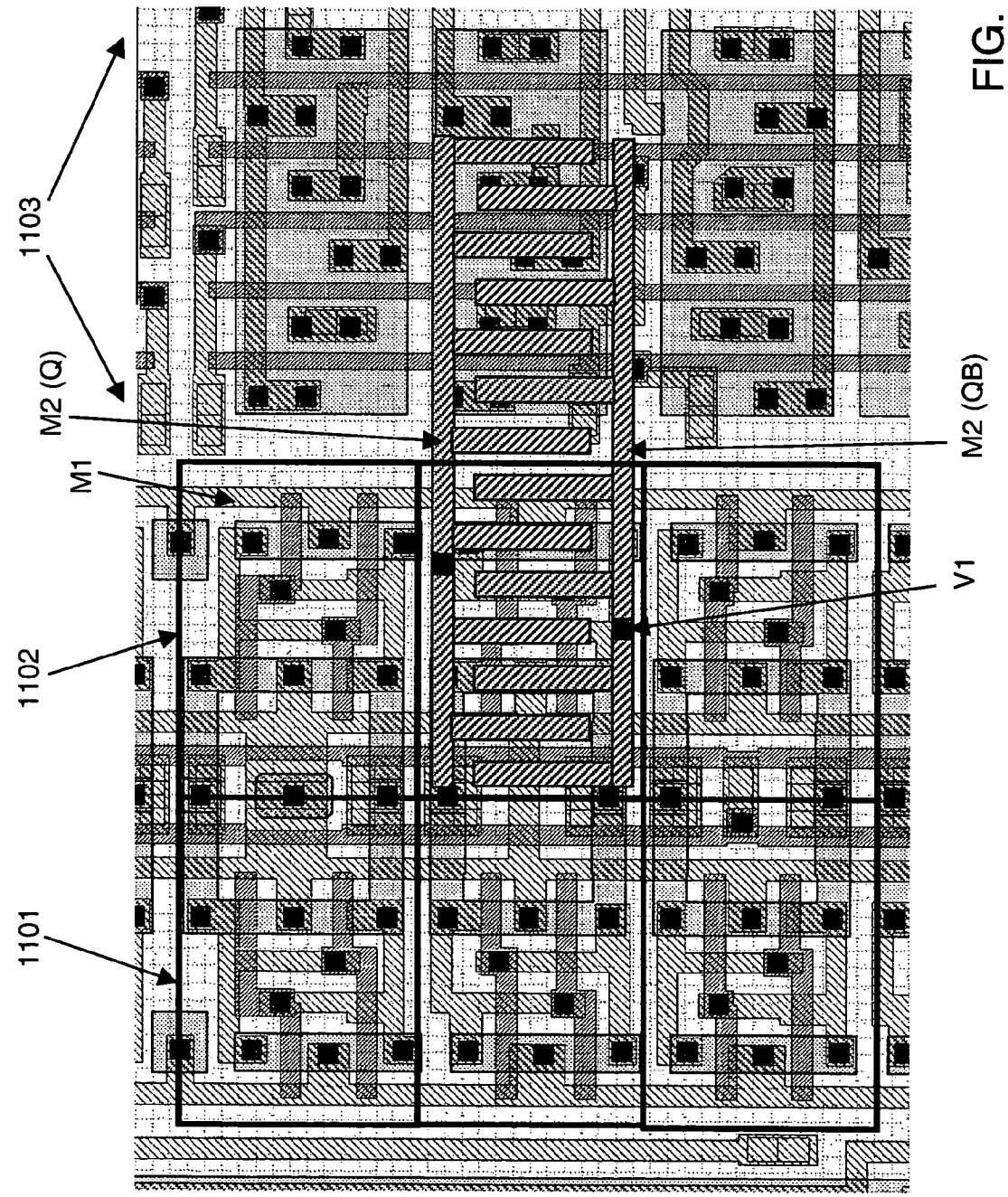
FIG. 11 illustrates an exemplary layout for a static memory cell (e.g., a configuration memory cell) as in FIG. 9, utilizing a metal-to-metal capacitor to reduce the susceptibility of the cell to SEUs.

FIG. 11 illustrates an exemplary layout for a PLD configuration memory cell and configurable user elements similar to those shown in FIG. 9. The left-hand portion of FIG. 11 shows two columns of configuration memory cells denoted by black boxes, including configuration memory cells 1101 in the first column and 1102 in the second column. The right-hand portion of FIG. 11 shows configurable user elements 1103 controlled by both columns of configuration memory cells. The added capacitor for only one configuration memory cell is shown in FIG. 11, to illustrate the extent of the metal-to-metal capacitor between nodes Q and QB.

The added capacitor in FIG. 11 is twice the size of the configuration memory cell to which the added capacitor is attached. However, this size is purely exemplary. The added metal-to-metal capacitors can be of any desired size that can be accommodated by the device layout. For example, the capacitors can be much larger than twice the size of the configuration memory cell. Additionally, the size of the added capacitors can be different for different memory cells in the same device, or even in the same region of a device. For example, more heavily loaded storage nodes already have greater protection against SEUs, because of their intrinsic capacitance. Thus, the available area can be used to add capacitance only to those nodes in most need of it, or to add more capacitance to some nodes and less capacitance to others.

Note that in the pictured embodiment the capacitor is implemented as two nodes Q and QB on the same metal layer (M2, also known as second-layer metal or metal2) and having interleaved fingers of metal to increase the capacitance between the two nodes. Because metal2 is already extensively used in this particular integrated circuit, no additional processing steps are needed to implement the metal-to-metal capacitors. The metal2 capacitive elements are coupled to the storage nodes in the configuration memory cell through metal1-to-metal2 (M1-to-M2) vias, e.g., via V1. The metal-to-metal capacitor also advantageously increases the parasitic capacitance of both nodes. A metal-to-metal capacitor can also be used, for example, to implement the embodiments of FIGS. 7, 8, and 10.

Note that the metal-to-metal capacitor illustrated in FIG. 11 is an idealized version of the metal-to-metal capacitor that would likely be used in a configuration memory cell. As previously mentioned, metal2 is already used in this circuit. Therefore, the metal-to-metal capacitor would likely have openings that would allow for this already-present metal2. Further, a connection might be required between layers positioned above and below the metal2 layer, e.g., between metal1 and metal3 layers. Such a connection would also require that an opening be left in the metal-to-metal capacitor. Therefore, FIG. 11 is provided as a conceptual tool to facilitate understanding of the invention, and not as an actual layout that would likely be used to implement the capacitor.

In some embodiments, interleaved metal fingers are added to multiple metal layers, adding yet more capacitance between the multiple metal layers. In some embodiments, e.g., where a single metal layer is used to implement the metal-to-metal capacitors, a high-K dielectric material is included in the area between the metal fingers to increase the capacitance between them. In some embodiments, the metal-to-metal capacitors are added in the form of layer-to-layer capacitors between two vertically-adjacent metal layers, i.e., between the two top layers provided by an IC fabrication process. The two metal layers are separated by a dielectric material, e.g., a high-K dielectric material.

Figure 12:
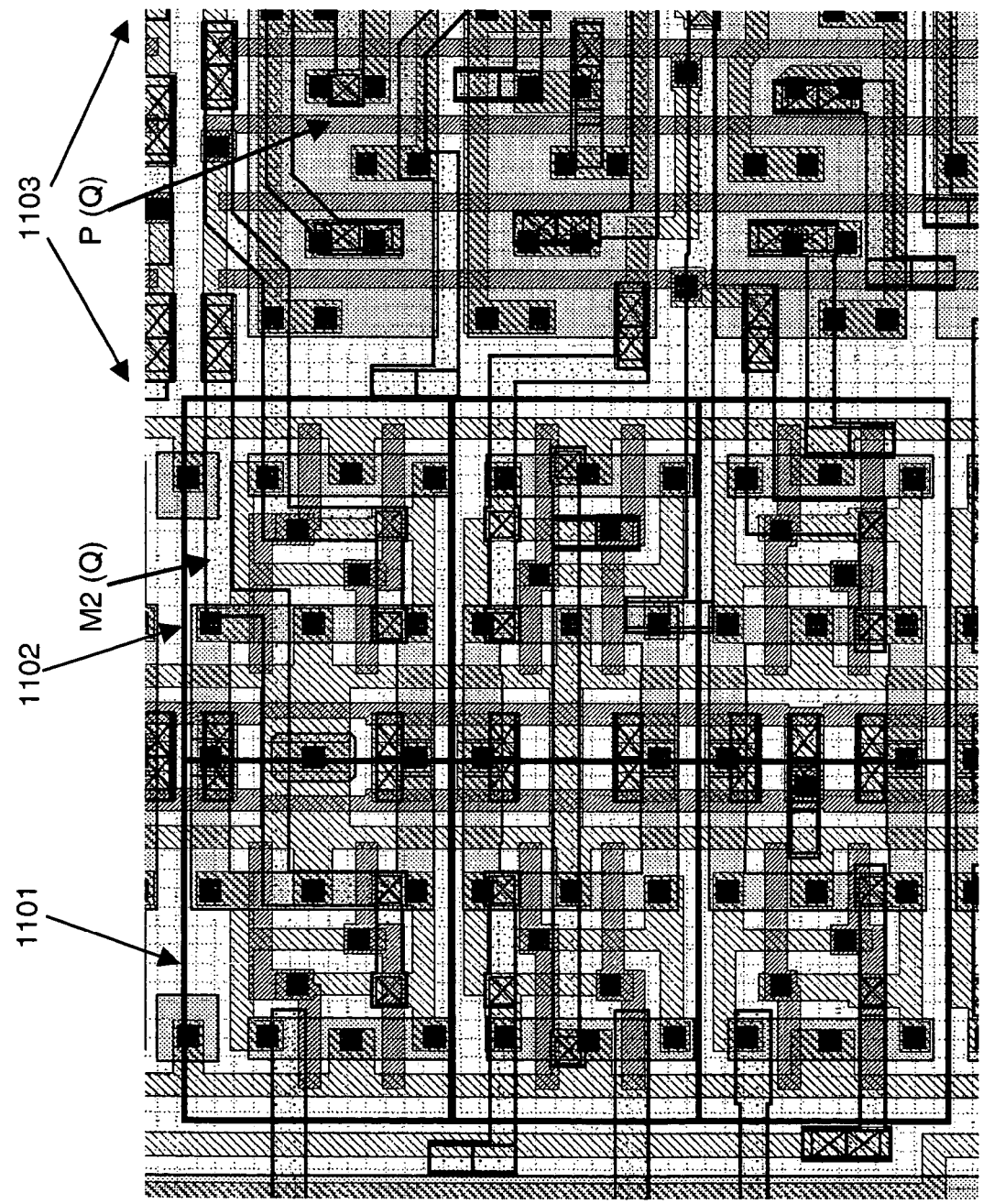
FIG. 12 illustrates an exemplary layout for a configuration memory cell utilizing metal-to-metal parasitic capacitance to reduce the susceptibility of the cell to SEUs.

Other types of metal-to-metal capacitors can also be used with any of the configuration memory cells pictured in FIGS. 7-9. For example, FIG. 12 illustrates another exemplary layout for a PLD configuration memory cell and the configurable user elements controlled by the configuration memory cells. In the layout of FIG. 12, the added capacitor is implemented as a parasitic capacitance. The label "M2 (Q)" identifies the metal2 wire distributing storage node Q, and the label "P (Q)" identifies the polysilicon layer coupled to node Q and implementing the pass gates driven by node Q.

In prior art PLDs, pass gates controlled by a configuration memory cell were deliberately placed in close proximity to the configuration memory cell. However, in FIG. 12 the wires distributing node Q are designed to cover an unnecessarily large distance, thereby increasing the parasitic capacitance. Note, for example, that the pass gates controlled by the configuration memory cells in column 1101 (at the left side of the figure) are located in column 1103 (at the right side of the figure). The metal2 wire distributing storage node Q has added metal-to-metal parasitic capacitance to several nodes crossed by the wire in its way across column 1002, for example.

Figure 13:
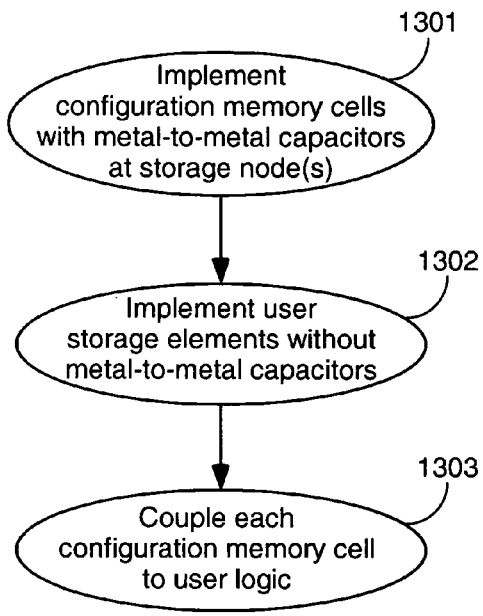
FIG. 13 illustrates the steps of a first method of reducing the susceptibility of a PLD to SEUs.

FIG. 13 illustrates the steps of a first method of reducing the susceptibility of a PLD to SEUs. The PLD includes a configuration plane and a user plane. These planes are conceptual planes rather than physical planes, as described above in connection with FIG. 6. The configuration plane includes configuration memory cells, and the user plane includes user storage elements (e.g., memory elements such as block RAM) controlled by the configuration memory cells.

In step 1301, the configuration memory cells are implemented with an added metal-to-metal capacitor on at least one of the storage nodes. The metal-to-metal capacitor can be, for example, a capacitor between the two storage nodes, or between either of the two storage nodes and ground, or additional parasitic capacitance on either of the two storage nodes. The metal-to-metal capacitor extends beyond a boundary of the configuration memory cell, e.g., as described above in conjunction with FIG. 7. In step 1302, the user storage elements are implemented without the added capacitance. In step 1303, either of the two storage nodes is coupled to user logic. In some embodiments, the user logic is one of the user storage elements. In other embodiments, the user logic is a configurable element other than one of the user storage elements.

Figure 14:
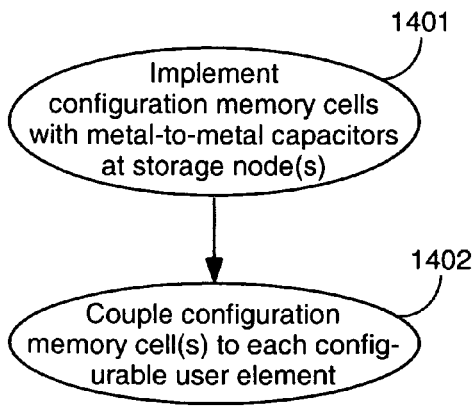
FIG. 14 illustrates the steps of a second method of reducing the susceptibility of a PLD to SEUs.

FIG. 14 illustrates the steps of a second method of reducing the susceptibility of a PLD to SEUs. The PLD includes a configuration plane and a user plane, where the configuration plane includes configuration memory cells and the user plane includes configurable user elements controlled by the configuration memory cells.

In step 1401, the configuration memory cells are implemented with a metal-to-metal capacitor on at least one of the storage nodes. The metal-to-metal capacitor can be, for example, a capacitor between the two storage nodes, or between either of the two storage nodes and ground, or additional parasitic capacitance on either of the two storage nodes. The metal-to-metal capacitor extends beyond a boundary of the configuration memory cell, e.g., as described above in conjunction with FIG. 7. In step 1402, at least one of the configuration memory cells is coupled to each of the configurable user elements. For example, either of the two storage nodes can be coupled to the configurable user element. The configurable user element can be, for example, a RAM block, another type of user storage element, a routing multiplexer, a lookup table, a configurable logic block (CLB), or some other type of configurable logic.

Figure 15:
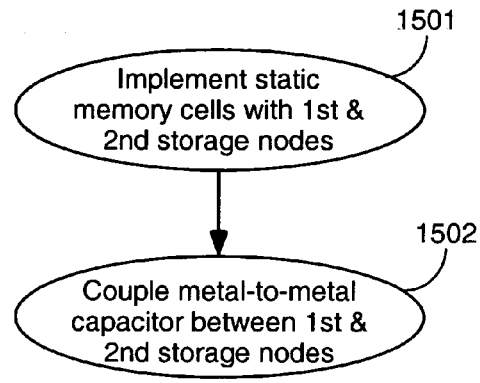
FIG. 15 illustrates the steps of a first method of reducing the susceptibility of an integrated circuit (IC) to SEUs.

FIG. 15 illustrates the steps of a first method of reducing the susceptibility of an integrated circuit (IC) to SEUs. In step 1501, two or more static memory cells are implemented utilizing first and second cross-coupled logic gates. Each of the logic gates has an output terminal coupled to a first or second storage node. In step 1502, a metal-to-metal capacitor is coupled between the first and second storage nodes of each static memory cell. The metal-to-metal capacitor extends beyond a boundary of the static memory cell, e.g., as described above in conjunction with FIG. 7. In some embodiments, the metal-to-metal capacitor is implemented by interleaving metal fingers implemented in a single metal layer. The IC can be, for example, a PLD (e.g., an FPGA), or some other type of integrated circuit (e.g., a non-programmable integrated circuit).

Figure 16:
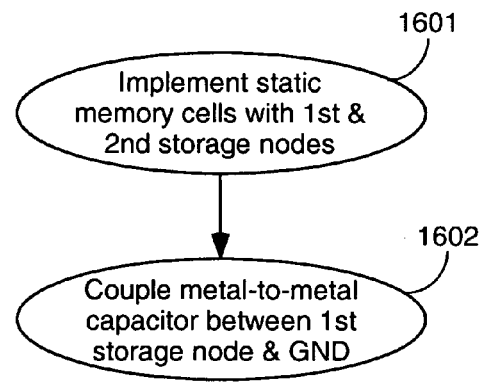
FIG. 16 illustrates the steps of a second method of reducing the susceptibility of an IC to SEUs.

FIG. 16 illustrates the steps of a second method of reducing the susceptibility of an IC to SEUs. In step 1601, two or more static memory cells are implemented utilizing first and second cross-coupled logic gates. Each of the logic gates has an output terminal coupled to a first or second storage node. In step 1602, a metal-to-metal capacitor is coupled between the first storage node and a ground terminal in each static memory cell. The metal-to-metal capacitor extends beyond a boundary of the static memory cell, e.g., as described above in conjunction with FIG. 7. In some embodiments, the metal-to-metal capacitor is implemented by interleaving metal fingers implemented in a single metal layer. The IC can be, for example, a PLD (e.g., an FPGA), or some other type of integrated circuit (e.g., a non-programmable integrated circuit).

Figure 17:
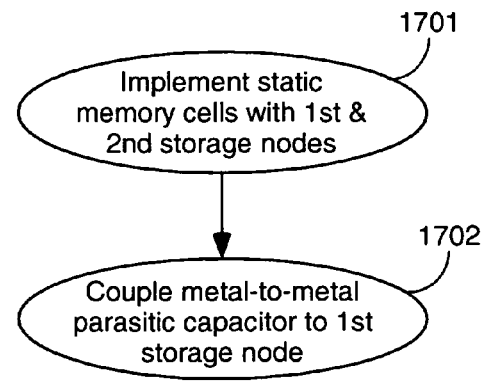
FIG. 17 illustrates the steps of a third method of reducing the susceptibility of an IC to SEUs.

FIG. 17 illustrates the steps of a third method of reducing the susceptibility of an IC to SEUs. In step 1701, two or more static memory cells are implemented utilizing first and second cross-coupled logic gates. Each of the logic gates has an output terminal coupled to a first or second storage node. In step 1702, a metal-to-metal capacitor is coupled to the first storage node. The metal-to-metal capacitor provides a parasitic capacitance to nodes outside a boundary of the static memory cell. This extension provides the area required to implement a large enough parasitic capacitor to reduce the susceptibility of the memory cell to SEUs. The IC can be, for example, a PLD (e.g., an FPGA), or some other type of integrated circuit (e.g., a non-programmable integrated circuit).

Those having skill in the relevant arts of the invention will now perceive various modifications and additions that can be made as a result of the disclosure herein. For example, the above text describes the circuits of the invention in the context of programmable logic devices (PLDs) such as FPGAs. However, some aspects of the invention can also be implemented in other integrated circuits, including non-programmable circuits.

Further, capacitors, memory cells, configuration memory cells, routing multiplexers, lookup tables, logic blocks, configurable logic blocks (CLBs), block RAMs, transistors, P-channel transistors, N-channel transistors, logic gates, inverters, pass gates, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Accordingly, all such modifications and additions are deemed to be within the scope of the invention, which is to be limited only by the appended claims and their equivalents.

What is claimed is:

1. An integrated circuit (IC) comprising static memory cells having reduced susceptibility to single event upsets (SEUs), each of the static memory cells comprising:

first and second cross-coupled logic gates having output terminals coupled to first and second storage nodes, respectively, the first and second storage nodes having an intrinsic capacitance therebetween; and a metal-to-metal capacitor coupled between the first and second storage nodes, the metal-to-metal capacitor providing additional capacitance not included in the intrinsic capacitance, wherein the metal-to-metal capacitor extends beyond a boundary of the static memory cell.

2. The IC of claim 1, wherein the metal in the metal-to-metal capacitor comprises interleaved metal fingers implemented in a single metal layer.

3. The IC of claim 2, wherein areas between the metal fingers comprise a high-K dielectric material.

4. The IC of claim 1, wherein the metal in the metal-to-metal capacitor comprises a plurality of vertically adjacent metal layers separated by a dielectric material.

5. The IC of claim 1, wherein the IC comprises a programmable logic device (PLD).

6. The IC of claim 5, wherein the PLD comprises a field programmable gate array (FGPA), and the static memory cell comprises a configuration memory cell of the FPGA.

7. The IC of claim 1, wherein the metal-to-metal capacitors in different ones of the static memory cells are of different sizes.

8. A method of reducing the susceptibility of an integrated circuit (IC) to single event upsets (SEUs), the method comprising:

implementing a plurality of static memory cells utilizing first and second cross-coupled logic gates having output terminals coupled to first and second storage nodes, respectively, the first and second storage nodes having an intrinsic capacitance therebetween; and coupling a metal-to-metal capacitor between the first and second storage nodes in each static memory cell, the metal-to-metal capacitor providing additional capacitance not included in the intrinsic capacitance, wherein the metal-to-metal capacitor extends beyond a boundary of the static memory cell.

9. The method of claim 8, wherein coupling the metal-to-metal capacitor comprises interleaving metal fingers implemented in a single metal layer.

10. The method of claim 8, wherein the IC comprises a programmable logic device (PLD).

11. The method of claim 10, wherein the PLD comprises a field programmable gate array (FGPA), and the static memory cell comprises a configuration memory cell of the FPGA.

12. The method of claim 8, wherein the metal-to-metal capacitors in different ones of the static memory cells are of different sizes.

* * * * *